(12) United States Patent
Her et al.

(10) Patent No.: US 9,496,013 B1
(45) Date of Patent: Nov. 15, 2016

(54) SEMICONDUCTOR DEVICE AND OPERATING METHOD THEREOF

(71) Applicant: Sk hynix Inc., Gyeonggi-do (KR)

(72) Inventors: Min Ho Her, Chungcheongbuk-do (KR); Seung Woo Lee, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/933,509

(22) Filed: Nov. 5, 2015

(30) Foreign Application Priority Data

May 29, 2015 (KR) .................. 10-2015-0076000

(51) Int. Cl.
*G11C 16/04* (2006.01)
*G11C 7/22* (2006.01)
*G11C 11/56* (2006.01)
*G11C 8/10* (2006.01)

(52) U.S. Cl.
CPC . *G11C 7/22* (2013.01); *G11C 8/10* (2013.01); *G11C 11/56* (2013.01)

(58) Field of Classification Search
USPC .......................... 365/185.17, 185.22, 185.18
See application file for complete search history.

(56) References Cited

U.S. PATENT DOCUMENTS

| | | | | |
|---|---|---|---|---|
| 5,923,587 | A * | 7/1999 | Choi | G11C 11/5621 257/E27.103 |
| 2014/0085989 | A1* | 3/2014 | Fukuzumi | G11C 16/0483 365/185.23 |

FOREIGN PATENT DOCUMENTS

| | | |
|---|---|---|
| KR | 1020140135402 | 11/2014 |
| KR | 1020160058521 | 5/2016 |

* cited by examiner

*Primary Examiner* — Vu Le
(74) *Attorney, Agent, or Firm* — I P & T Group LLP

(57) ABSTRACT

A semiconductor device includes memory blocks including a plurality of strings in which memory cells are coupled between select transistors; a peripheral circuit suitable for erasing or programming the select transistors and the memory cells, which are included in a selected memory block among the memory blocks; and a control circuit suitable for controlling the peripheral circuit to erase the select transistors and the memory cells, increasing a threshold voltage of the select transistors within a range below an erase level, and increasing the threshold voltage of the select transistors up to a program level.

21 Claims, 10 Drawing Sheets

SEMICONDUCTOR DEVICE AND OPERATING METHOD THEREOF

CROSS-REFERENCE TO RELATED APPLICATION

The present application claims priority to Korean patent application number 10-2015-0076000, filed on May 29, 2015, the entire disclosure of which is herein incorporated by reference in its entirety.

BACKGROUND

1. Field of Invention

Embodiments of the present disclosure relate to a semiconductor device and an operating method thereof, and more particularly, to a soft program operation after an erase operation.

2. Description of the Related Art

Nonvolatile semiconductor memory devices can retain data even without power. NAND memory devices, which are a type of nonvolatile semiconductor memory, are able to achieve large storage capacities with low power consumption. Therefore, NAND memory devices are frequently used in notebook computers, mobile devices, etc.

Nonvolatile memory devices can be classified into two-dimensional nonvolatile memory devices and three-dimensional nonvolatile memory devices depending on the memory cell string structures. In two-dimensional memory devices, the strings are parallel to the substrate. In three-dimensional memory devices, the strings are perpendicular to a substrate. That is, three-dimensional nonvolatile memory devices have vertical channel layers arranged perpendicular to the substrate, memory layers surrounding the vertical channel layers, and word lines stacked and spaced apart along the memory layers.

SUMMARY

Embodiments provide a semiconductor device and an operating method thereof capable of performing a sub-soft program operation on erased memory cells in order to narrow the threshold voltage distribution of select transistors, dummy cells, and memory cells.

According to an aspect of the present disclosure, there is provided a semiconductor device including: memory blocks including a plurality of strings in which memory cells are coupled between select transistors; a peripheral circuit suitable for erasing or programming the select transistors and the memory cells, which are included in a selected memory block among the memory blocks; and a control circuit suitable for controlling the peripheral circuit to erase the select transistors and the memory cells, increasing a threshold voltage of the select transistors within a range below an erase level, and increasing the threshold voltage of the select transistors up to a program level.

According to an aspect of the present disclosure, there is provided a method of operating a semiconductor device, the method including: erasing select transistors and memory cells; increasing a threshold voltage of the select transistors within a range below an erase level by applying a sub-soft program voltage to select lines coupled to the select transistors; and increasing the threshold voltage of the select transistors up to a program level by programming the select transistors.

BRIEF DESCRIPTION OF THE DRAWINGS

Embodiments will now be described more fully hereinafter with reference to the accompanying drawings; however, the invention may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity. It will be understood that when an element is referred to as being "between" two elements, it can be the only element between the two elements, or one or more intervening elements may also be present. Like reference numerals refer to like elements throughout.

DETAILED DESCRIPTION

Hereinafter, embodiments of the present disclosure will be described in detail with reference to the accompanying drawings. However, the invention disclosed is not limited to these embodiments but may be implemented in different forms. These embodiments are provided only for illustrative purposes and for full understanding of the scope of the present disclosure for those skilled in the art.

Figure 1:
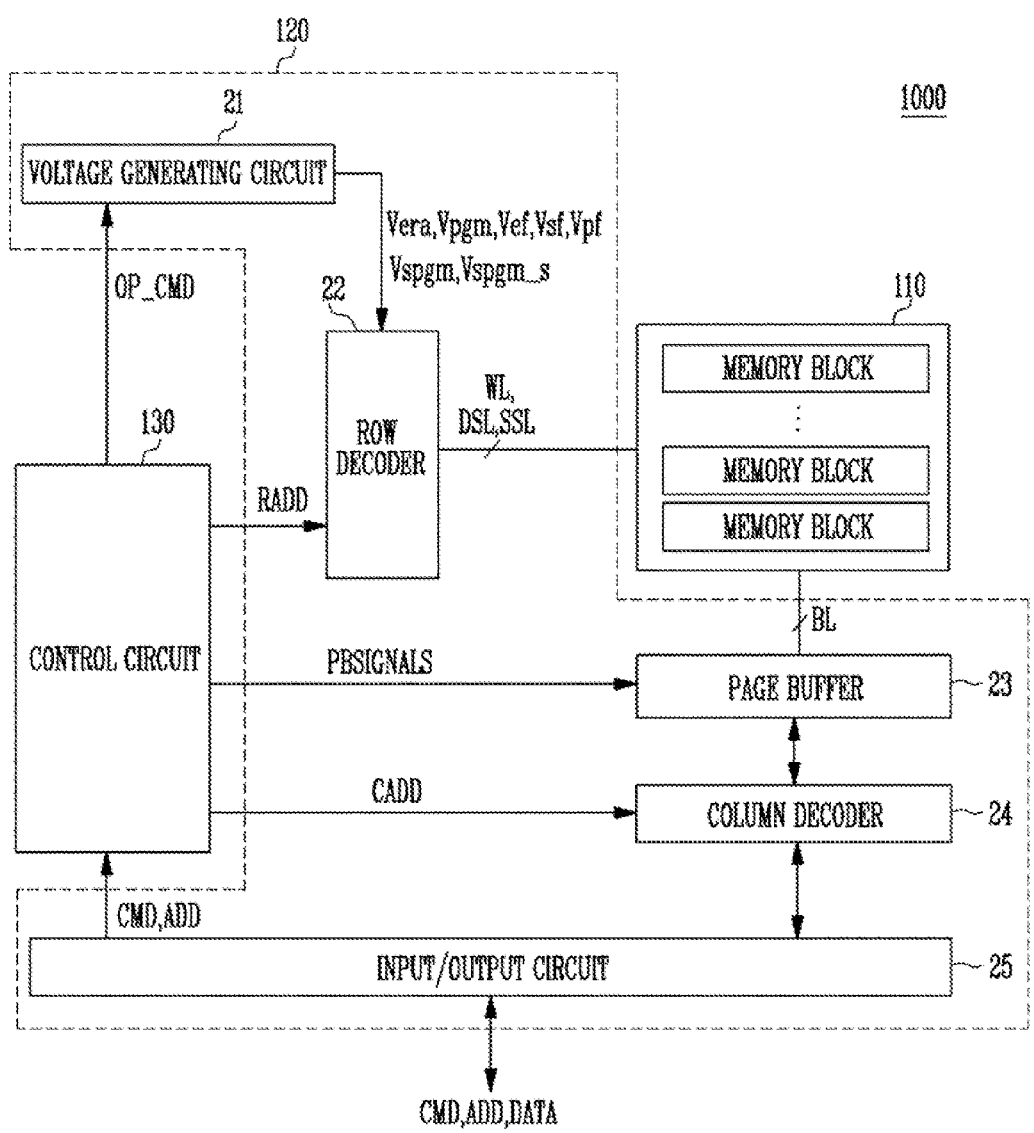
FIG. 1 is a block diagram illustrating a semiconductor device according to an embodiment of the present disclosure.

FIG. 1 is a block diagram illustrating a semiconductor device according to an embodiment of the present disclosure.

Referring to FIG. 1, the semiconductor device 1000 includes a memory cell array 110, a peripheral circuit 120 configured to perform a program operation, read operation, or erase operation of the memory cell array 110, and a control circuit 130 configured to control the peripheral circuit 120.

The memory cell array 110 includes a plurality of memory blocks that are identically configured. Each of the memory blocks includes a plurality of strings. The plurality of strings include a plurality of memory cells in which data are stored, and may be formed in a three-dimensional structure in which the plurality of strings are arranged perpendicular to a substrate. Each of the plurality of memory cells may be formed as a single level cell (SLC) in which 1-bit data is stored, or may be formed as a multi level cell (MLC), a triple level cell (TLC), or a quadruple level cell (QLC), in which 2-bit or more data is stored. The MLC is a memory cell in which 2-bit data is stored, the TLC is a memory cell in which 3-bit data is stored, and the QLC is a memory cell in which 4-bit data is stored.

The peripheral circuit 120 includes a voltage generating circuit 21, a row decoder 22, a page buffer 23, a column decoder 24, and an input/output circuit 25.

The voltage generating circuit 21 generates operation voltages of various levels in response to an operation signal OP_CMD. For example, the voltage generating circuit 21 may generate an erase voltage Vera, a main program voltage Vpgm, an erase verify voltage Vef, a main soft program verify voltage Vsf, a program verify voltage Vpf, a main soft program voltage Vspgm, a sub-soft program voltage Vspgm_s, and the like. In addition, the voltage generating circuit 21 may generate various voltages necessary for various operations.

The row decoder 22 selects one of the memory blocks included in the memory cell array 110 in response to a row address RADD, and transmits operation voltages to word lines WL, drain select lines DSL, source select lines SSL, and the like, which are coupled to the selected memory block.

The page buffer 23 is coupled to the memory blocks through bit lines BL. The page buffer 23 transmits/receives data to/from a selected memory block in response to a page buffer control signal PBSIGNALS when program, read, and erase operations are performed, and temporarily stores the transmitted/received data.

The column decoder 24 transmits/receives data between the page buffer 23 and the input/output circuit 25 in response to a column address CADD.

The input/output circuit 25 transmits, to the control circuit 130, a command CMD and an address ADD, which are transmitted from outside, and transmits the data DATA transmitted from the outside to the column decoder 24 or output data DATA transmitted from the column decoder 24 to the outside.

The control circuit 130 controls the peripheral circuit 120 in response to the command and the address ADD. Particularly, upon completion of an erase operation of a selected memory block during an erase operation of the memory cell array 110, the control circuit 130 controls the peripheral circuit 120 such that a sub-soft program operation is performed on the erased memory block. The sub-soft program operation may be performed to narrow the threshold voltage distribution of erased select transistors and dummy cells. In a three-dimensional nonvolatile memory device including a pipe transistor, the sub-soft program operation may be performed to narrow the threshold voltage distribution of the pipe transistor. Also, the sub-soft program operation may be performed to narrow the threshold voltage distribution of erased memory cells. In a structure in which any dummy cell is not included in a string, the control circuit 130 may control the peripheral circuit 120 such that the sub-soft program operation is performed to narrow the threshold voltage distribution of erased select transistors.

The three-dimensional nonvolatile memory device may be classified into an "I" type and a "U" type according to the string structure. Each type of three-dimensional nonvolatile memory device will be described in detail as follows.

Figure 2:
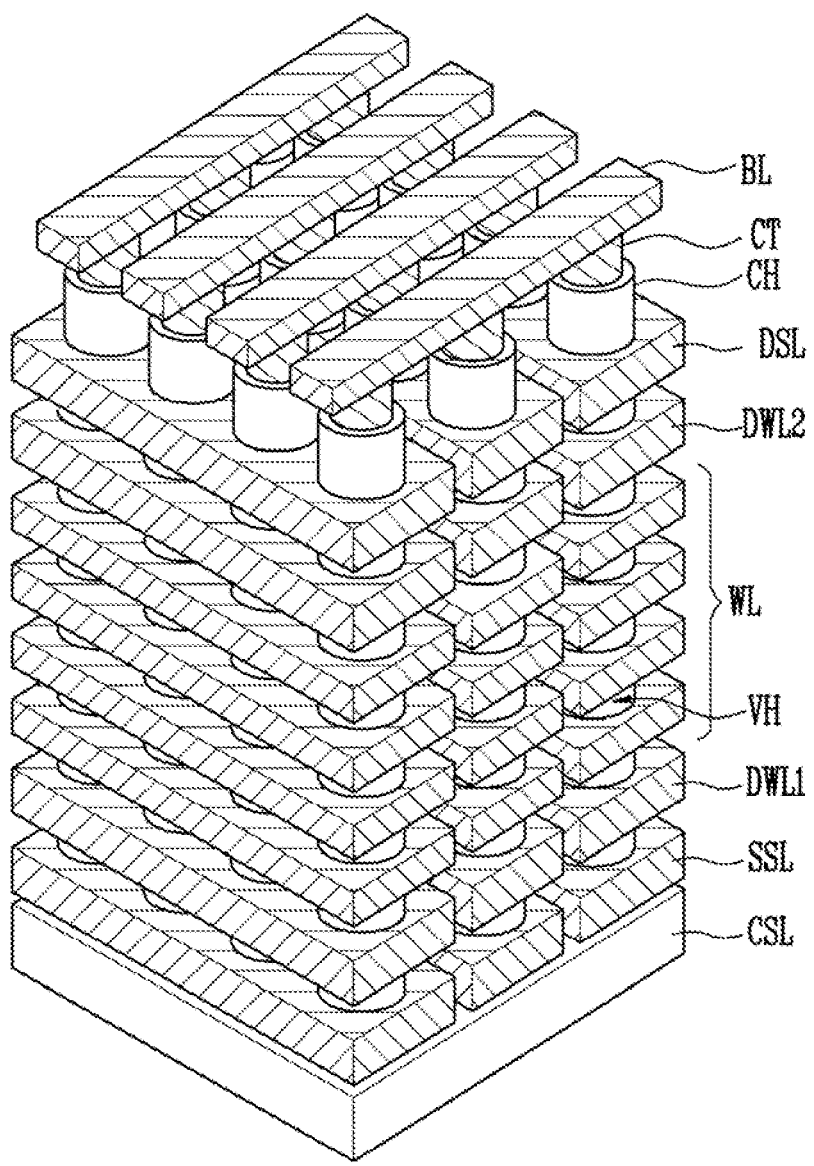
FIG. 2 is a perspective view illustrating a three-dimensional nonvolatile memory device according to an embodiment of the present disclosure.

FIG. 2 is a perspective view illustrating a three-dimensional nonvolatile memory device according to an embodiment of the present disclosure.

Referring to FIG. 2, memory blocks of the three-dimensional nonvolatile memory device may include strings vertically arranged between bit lines BL and a common source line CSL. This structure is also referred to as a bit cost scalable (BICS) structure. For example, when the common source line CSL is formed in parallel on a substrate, the strings may be formed in a vertical direction on the common source line CSL. More specifically, the strings may include source select lines SSL, first dummy lines DWL1, word lines WL, second dummy lines DWL2, and drain select lines DSL, which are arranged in a first direction and stacked to be spaced apart from each other. Also, the strings may include vertical channel layers CH contacting the common source line CSL by vertically penetrating the source select lines SSL, the first dummy lines DWL1, the word lines WL, the second dummy lines DWL2, and the drain select lines DSL. The bit lines BL may be arranged in a second direction perpendicular to the first direction while contacting the tops of the vertical channel layers CH protruding upward from the drain select lines DSL. Also, contact plugs CT may be further formed between the bit lines BL and the vertical channel layers CH.

Figure 3:
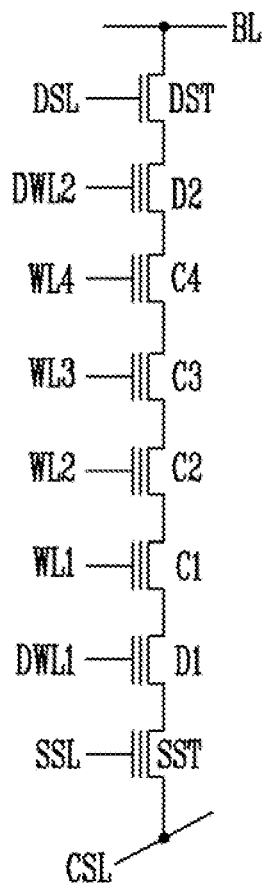
FIG. 3 is a circuit diagram illustrating the three-dimensional nonvolatile memory device shown in FIG. 2.

FIG. 3 is a circuit diagram illustrating the three-dimensional nonvolatile memory device described with reference to FIG. 2.

Referring to FIG. 3, a string may include a source select transistor SST, a first dummy cell D1, a plurality of memory cells C1 to C4, a second dummy cell, and a drain select transistor DST, which are coupled in series between a common source line CSL and a bit line BL. In FIG. 3, one source select transistor SST, one first dummy cell D1, one second dummy cell D2, one drain select transistor DST, and four memory cells C1 to C4 are shown. However, this is merely an example for illustrative purposes, and a larger number of source select transistors, first dummy cells, memory cells, second dummy cells, and drain select transistors may be included.

Figure 4:
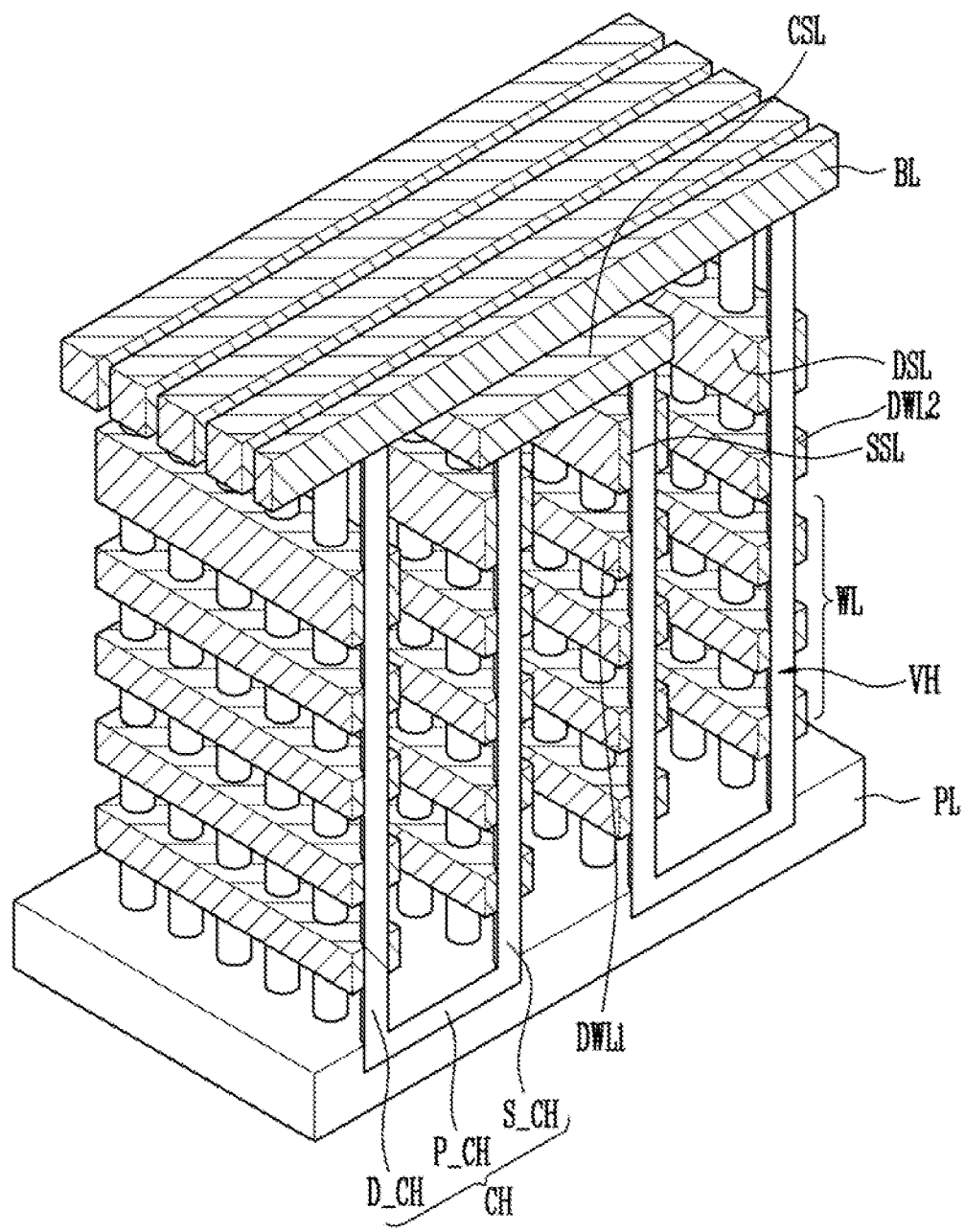
FIG. 4 is a perspective view illustrating a three-dimensional nonvolatile memory device according to another embodiment of the present disclosure.

FIG. 4 is a perspective view illustrating a three-dimensional nonvolatile memory device according to another embodiment of the present disclosure.

Referring to FIG. 4, the three-dimensional nonvolatile memory device may be formed in a structure in which first sub-strings vertically arranged between common source lines CSL and a pipe line PL and second sub-strings vertically arranged between bit lines BL and the pipe line PL are coupled in an area of the pipe line PL. This structure is also referred to as pipe-shaped bit cost scalable (P-BiCS) structure. More specifically, the first sub-strings may include word lines WL and first dummy lines DWL1, which are arranged in a first direction and stacked to be spaced apart from each other. Also, the first sub-strings may include first vertical channel layers S_CH vertically penetrating the word lines WL and the first dummy lines DWL1. The second sub-strings may include the word lines WL and second dummy lines DWL2, which are arranged in the first direction and stacked to be spaced apart from each other. Also, the second sub-strings may include second vertical channel layers D_CH vertically penetrating the word lines and the second dummy lines DWL2.

The first vertical channel layers S_CH and the second vertical channel layers D_CH are coupled through pipe channel layers P_CH formed in the pipe line PL. The bit lines BL are arranged in a second direction perpendicular to the first direction while contacting the tops of the second vertical channel layers D_CH protruding upward from the drain select lines DSL.

Figure 5:
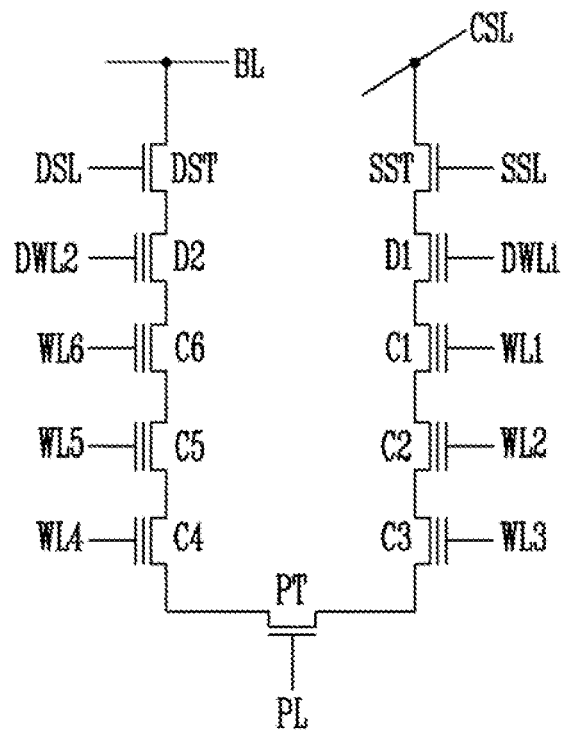
FIG. 5 is a circuit diagram illustrating the three-dimensional nonvolatile memory device shown in FIG. 4.

FIG. 5 is a circuit diagram illustrating the three-dimensional nonvolatile memory device described with reference to FIG. 4.

Referring to FIG. 5, a string may include a source select transistor SST, a first dummy cell D1, and first to third memory cells C1 to C3, which are coupled in series between a common source line CSL and a pipe transistor PT, and fourth to sixth memory cells C4 to C6, a second dummy cell D2, and a drain select transistor DST, which are coupled in series between the pipe transistor PT and a bit line BL. In FIG. 5, one source select transistor SST, one first dummy cell D1, one second dummy cell D2, one drain select transistor DST, and six memory cells C1 to C6 are shown. However, this is merely an example for illustrative purposes, and a larger number of source select transistors, first dummy cells, memory cells, second dummy cells, and drain select transistors may be included according to nonvolatile memory devices.

An operating method of a semiconductor device including the above-described memory device will be described as follows.

Figure 6:
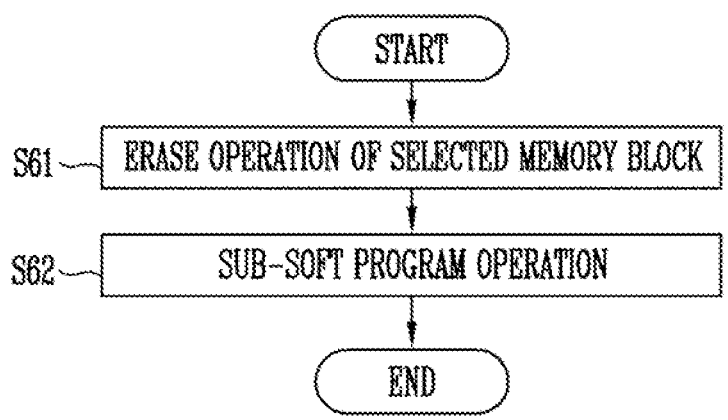
FIG. 6 is a flowchart illustrating an operating method of a semiconductor device according to an embodiment of the present disclosure.

FIG. 6 is a flowchart illustrating an operating method of a semiconductor device according to an embodiment of the present disclosure.

Referring to FIG. 6, in response to an erase command of the control circuit 130, the peripheral circuit 120 performs an erase operation to a selected memory block at step s61, and a sub-soft program operation to the erased memory block at step s62.

The above-described erase operation of step s61 and sub-soft program operation of step s62 will be described in detail as follows.

Figure 7:
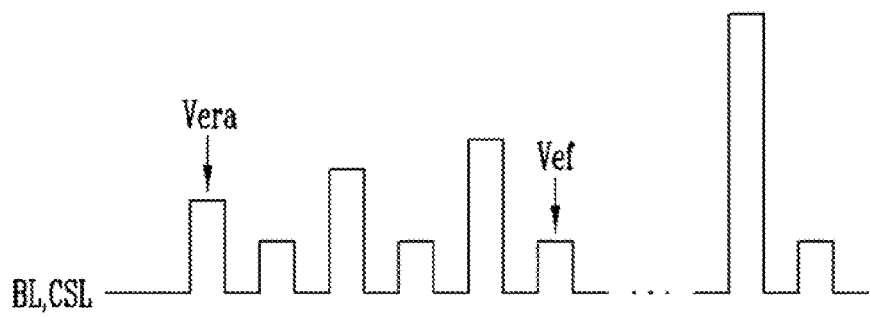
FIG. 7 is a voltage application graph illustrating an erase operation of FIG. 6.

FIG. 7 is a voltage application graph illustrating the erase operation of FIG. 6.

Referring to FIG. 7, at step s61, the erase operation may be performed on the selected memory block using an incremental step pulse erase (ISPE) method. For example, the erase operation may include erasing memory cells and verifying the memory cells. The erasing of memory cells may be performed by applying the erase voltage Vera to the bit lines BL and the common source line CSL. While the memory cells are erased, 0V is applied to word lines WL coupled to the memory cells. The verifying of memory cells is performed by applying the erase verify voltage Vef to the word lines WL. When the verifying of memory cells fails, the erase voltage Vera is increased by a step voltage, and the erasing and the verifying of memory cells are again performed. In this manner, the erasing and the verifying are repeated until the verifying passes.

When the verifying of memory cells passes, the sub-soft program operation of step s62 is performed. The sub-soft program operation of step s62 will be described in detail as follows.

Figure 8:
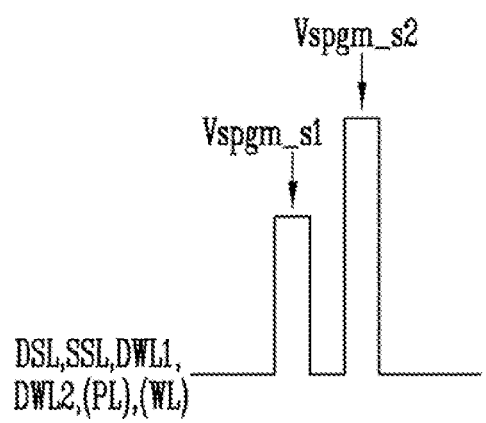
FIG. 8 is a voltage application graph illustrating a sub-soft program operation of FIG. 6.

FIG. 8 is a voltage application graph illustrating the sub-soft program operation of step s62.

Referring to FIG. 8, the sub-soft program operation of step s62 of FIG. 6 is performed to narrow the threshold voltage distribution of select transistors, dummy cells, and memory cells, and to prevent the generation of leakage current in the string. To this end, a positive sub-soft program voltage may be applied to the drain select lines DSL, the source select lines SSL, and the dummy lines DWL1 and DWL2. For example, one or more sub-soft program voltages may be applied to the drain select lines DSL, the source select lines SSL, and the dummy lines DWL1 and DWL2. During the sub-soft program operation of step s62, a first sub-soft program voltage Vspgm_s1 may be applied to the drain select lines DSL, the source select lines SSL, and the dummy lines DWL1 and DWL2. Alternatively, the first and second sub-soft program voltage Vspgm_s1 and Vspgm_s2 may be applied to the drain select lines DSL, the source select lines SSL, and the dummy lines DWL1 and DWL2. The second sub-soft program voltage Vspgm_s2 may be higher than the first sub-soft program voltage Vspgm_s1. For example, the second sub-soft program voltage Vspgm_s2 may be applied to the drain select lines DSL, the source select lines SSL, and the dummy lines DWL1 and DWL2 after the application of the first sub-soft program voltage Vspgm_s1 and then discharge of the drain select lines DSL, the source select lines SSL, and the dummy lines DWL1 and DWL2.

The sub-soft program operation is an operation for narrowing the threshold voltage distribution by increasing low threshold voltages of the select transistors, dummy cells, and the memory cells, which are in an erase state. Hence, the sub-soft program operation is performed through one or more sub-soft program voltages without any verify operation. During the sub-soft program operation, one or more of the first and second sub-soft program voltages Vspgm_s1 and Vspgm_s2 may also be applied to the word lines WL.

The above-described sub-soft program operation of step s62 may be applied to the three-dimensional nonvolatile memory devices including the "I" type and "U" type strings. Particularly, the three-dimensional nonvolatile memory device including the "U" type strings includes pipe gates PT coupled to the pipe lines PL. Therefore, when the sub-soft program operation is performed, one or more of the first and second sub-soft program voltages Vspgm_s1 and Vspgm_s2 may also be applied to the pipe lines PL.

Figure 9:
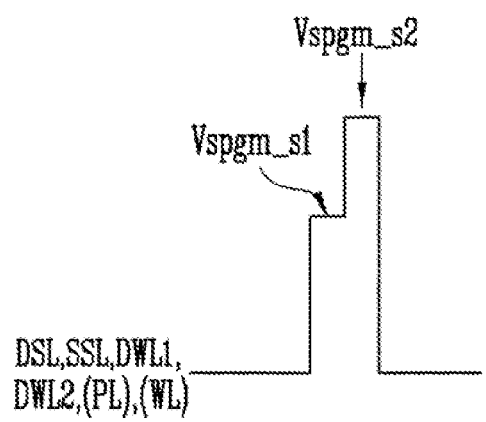
FIG. 9 is a view illustrating a sub-soft program operation of FIG. 6.

FIG. 9 is a voltage application graph illustrating the sub-soft program operation of step s62 as another example.

Referring to FIG. 9, during the sub-soft program operation of step s62, the first and second sub-soft program voltages Vspgm_s1 and Vspgm_s2 may be continuously applied to the drain select lines DSL, the source select lines SSL, and the dummy lines DWL1 and DWL2 to reduce operation time. The first and second sub-soft program voltages Vspgm_s1 and Vspgm_s2 may also be applied to the pipe lines PL and the word lines WL.

Figure 10:
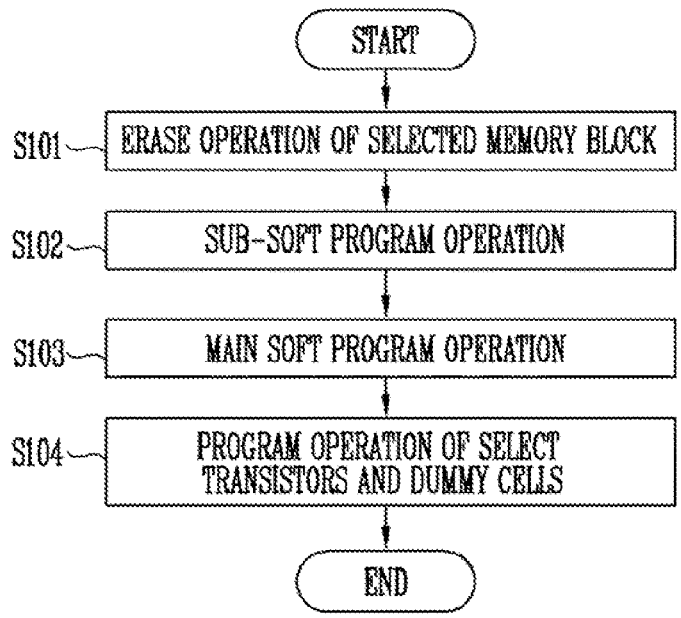
FIG. 10 is a flowchart illustrating an operating method according to another embodiment of the present disclosure.

FIG. 10 is a flowchart illustrating an operating method according to another embodiment of the present disclosure.

Referring to FIG. 10, in response to an erase command of the control circuit 130, the peripheral circuit 120 performs an erase operation to a selected memory block at step s61, and a sub-soft program operation to the erased memory block at step s62. The peripheral circuit 120 further performs a main soft program operation of step s103 and then a program operation of step s104 increasing the threshold voltages of select transistors and dummy cells up to a program level higher than 0V.

The erase operation of step s101 and the sub-soft program operation of step s102 are the same as the erase operation of step s61 and the sub-soft program operation of step s62 described with reference to FIGS. 7 to 9. The main soft program operation of step s103 and the program operation of step s104 will be described in detail as follows.

Figure 11:
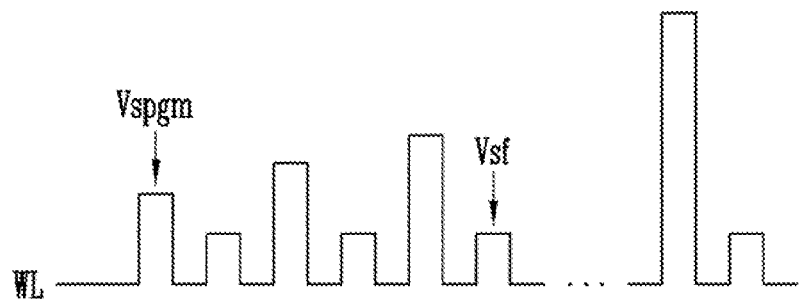
FIG. 11 is a voltage application graph illustrating a main soft program operation of FIG. 10.

FIG. 11 is a voltage application graph illustrating the main soft program operation of step s103 according to an embodiment of FIG. 10.

Referring to FIG. 11, the main soft program operation of step s103 of FIG. 10 is performed to increase the threshold voltage of memory cells in an erase state in the range below an erase level lower than 0V. The main soft program operation may be performed using an incremental step pulse program (ISPP) method. For example, the main soft program operation may include programming memory cells and verifying the memory cells. The programming of memory cells may be performed by applying the soft program voltage Vspgm to the word lines WL. The verifying of memory cells may be performed by applying the main soft verify voltage Vsf to the word lines WL. When the verifying of memory cells fails, the programming and the verifying are repeated by increasing the soft program voltage Vspgm by a step voltage until the threshold voltage reaches a target level.

When the verifying of memory cells passes as the threshold voltage reaches the target level, the program operation of step s104 for increasing the threshold voltages of the select transistors and the dummy cells is performed. The program operation of step s104 of the select transistors and the dummy cells will be described in detail as follows.

Figure 12:
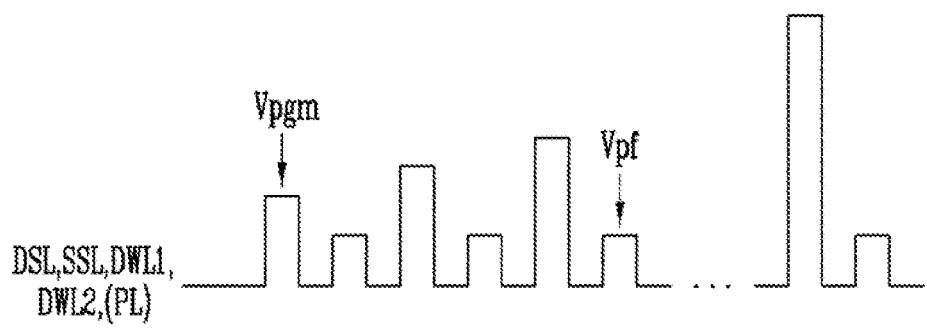
FIG. 12 is a voltage application graph illustrating a program operation of select transistors and dummy cells of FIG. 10.

FIG. 12 is a voltage application graph illustrating a program operation of the select transistors and the dummy cells according to another embodiment of FIG. 10.

Referring to FIG. 12, the program operation of step s104 is performed such that the select transistors and the dummy cells perform a switch function. The program operation of step s104 may be performed using the ISPP method. For example, the program operation of step s104 may include programming drain select transistors, source select transistors, and dummy cells and verifying the drain select transistors, the source select transistors, and the dummy cells. The programming of the drain select transistors, the source select transistors, and the dummy cells may be performed by applying the program voltage Vspgm to the drain select lines DSL, the source select lines SSL, and the first and second dummy lines DWL1 and DWL2. The verifying of the drain select transistors, the source select transistors, and the dummy cells verifies whether the threshold voltages of the drain select transistors, the source select transistors, and the dummy cells reach a target level by applying the program verify voltage Vpgm to the drain select lines DSL, the source select lines SSL, and the first and second dummy lines DWL1 and DWL2. When the verifying of the drain select transistors, the source select transistors, and the dummy cells fails, the programming and the verifying of the drain select transistors, the source select transistors, and the dummy cells are repeated by increasing the main program voltage Vpgm by a step voltage until the threshold voltages reach the target level. In a three-dimensional nonvolatile memory device having "U" type strings, the programming and the verifying of the drain select transistors, the source select transistors, and the dummy cells may also be performed on the pipe lines PL to simultaneously increase the threshold of the pipe transistor PT.

Changes in threshold voltages of the select transistors, the dummy cells, and the memory cells, which are caused by the above-described erase portions, sub-soft program operation, the main soft program operation, and program operation, are as follows.

Figure 13:
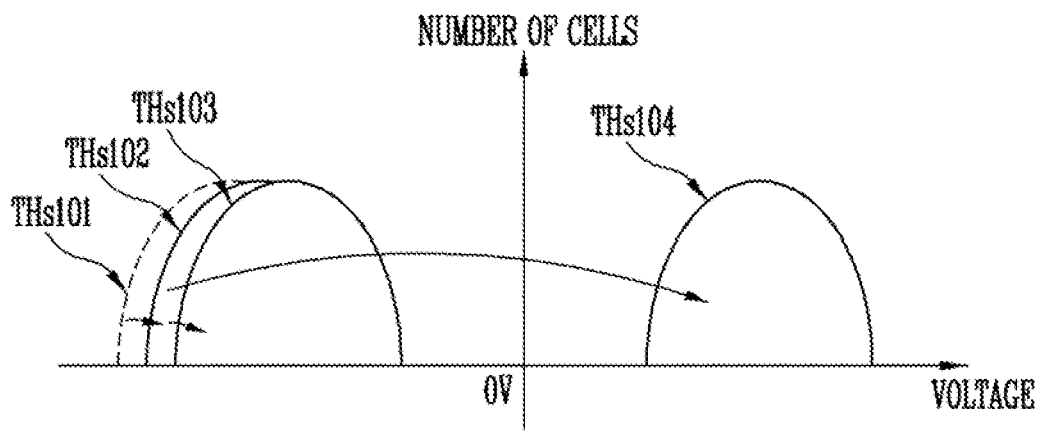
FIG. 13 is a threshold voltage distribution illustrating changes in threshold voltages according to the present disclosure.

FIG. 13 is a threshold voltage distribution illustrating changes in threshold voltages according to the present disclosure.

Referring to FIG. 13, as a result of the erase operation of step s101, the threshold voltages of the select transistors, the dummy cells, and the memory cells are distributed at a level lower than 0V, as indicated as "THs101" in the figure.

As a result of the sub-soft program operation of step s102, the threshold voltages of the select transistors and the dummy cells in the erase state are increased within the range below the erase level, as indicated as "THs102" in the figure. When the sub-soft program operation of step s102 is also performed on the memory cells, the threshold voltage of the memory cells may also be increased within the range below the erase level, as indicated as "THs102" in the figure.

As a result of the main soft program operation of step s103, the threshold voltage of the memory cells in the erase state is increased within the range below the erase level, as indicated as "THs103" in the figure.

As a result of the program operation of step s104, the threshold voltages of the select transistors and the dummy cells in the erase state become higher than 0V, as indicated as "THs104" in the figure, and accordingly the select transistors and the dummy cells can perform the switch function.

Particularly, since the threshold voltage distribution of the select transistors and the dummy cells is narrowed due to the sub-soft program operation of step s102, it is possible to prevent the threshold voltage distribution of the select transistors and the dummy cells from being widened during the program operation of step s104. Also, since the low level threshold voltages of select transistors and dummy cells are increased due to the sub-soft program operation of step s102, the generation of leakage current can be prevented as the result of the program operation of step s104.

Figure 14:
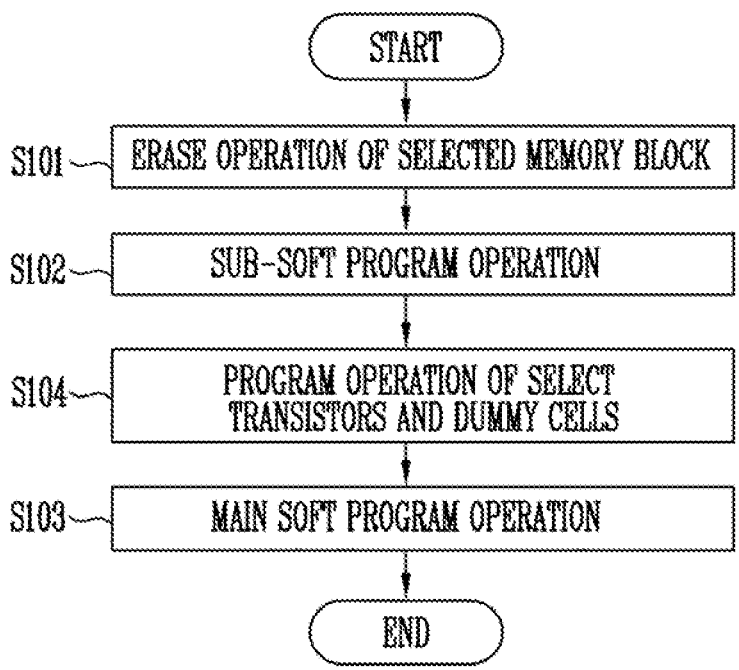
FIG. 14 is a flowchart illustrating an operating method according to still another embodiment of the present disclosure.

FIG. 14 is a flowchart illustrating an operating method according to still another embodiment of the present disclosure.

Steps s101 to s104 shown in FIG. 14 may be the same as steps 101 to s104 described with reference to FIGS. 10 to 13 except for the operation order between the program operation of step s104 and the main soft program operation of step s103.

Figure 15:
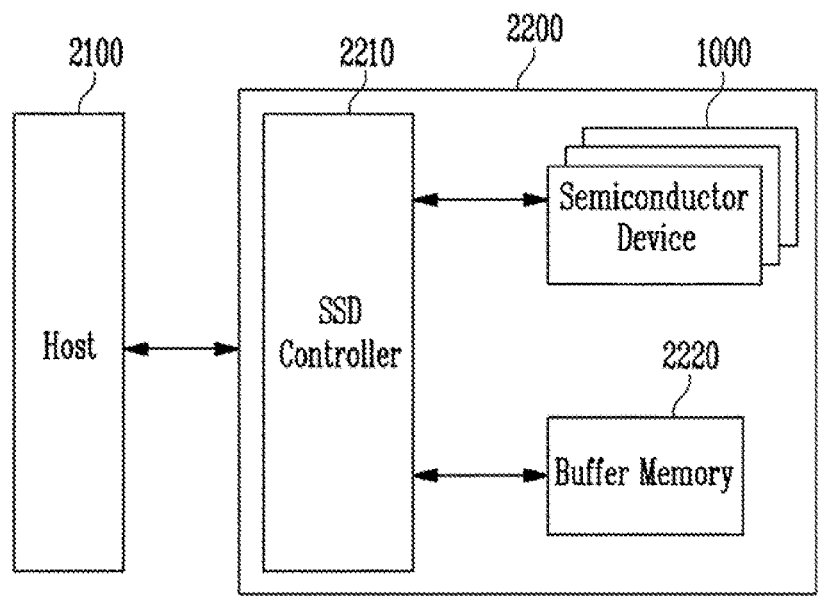
FIG. 15 is a block diagram illustrating a solid state drive including a semiconductor device according to an embodiment of the present disclosure.

FIG. 15 is a block diagram illustrating a solid state drive (SSD) including a semiconductor device according to an embodiment of the present disclosure.

Referring to FIG. 15, the drive device 2000 includes a host 2100 and an SSD 2200. The SSD includes an SSD controller 2210, a buffer memory 2220, and a semiconductor device 1000.

The SSD controller 2210 provides physical interconnection between the host 2100 and the SSD 2200. That is, the SSD controller 2210 provides an interface with the SSD 2200, corresponding to a bus format of the host 2100. Particularly, the SSD controller 2210 decodes a command provided from the host 2100. The SSD controller 2210 accesses the semiconductor device 1000 based on the decoded result. The bus format of the host 2100 may include a universal serial bus (USB), a small computer system interface (SCSI), a PCI express, an ATA, a parallel ATA (PATA), a serial ATA (SATA), a serial attached SCSI (SAS), and the like.

The buffer memory 2220 temporarily stores program data provided from the host 2100 or data read out from the semiconductor device 1000. When data existing in the semiconductor device 1000 is cached at a read request of the host 2100, the buffer memory 2220 supports a cache function to provide the cached data directly to the host 2100. Generally, the data transmission speed of a bus format (e.g., SATA or SAS) of the host 2100 may be higher than that of a memory channel of the SSD 2200. That is, when the interface speed of the host 2100 is faster than the transmission speed of the memory channel of the SSD 2200, a buffer memory 2200 with a large storage capacity is provided, thereby lowering the performance. The buffer memory 2220 may be provided as a synchronous DRAM to provide sufficient buffering to the SSD 2200 used as a large-capacity auxiliary storage device.

The semiconductor device 1000 may be provided as a storage medium of the SSD 2200. For example, the semiconductor device 1000, as described in FIG. 1, may be provided as a nonvolatile memory device having a large storage capacity. The semiconductor device may be provided as a NAND flash memory.

Figure 16:
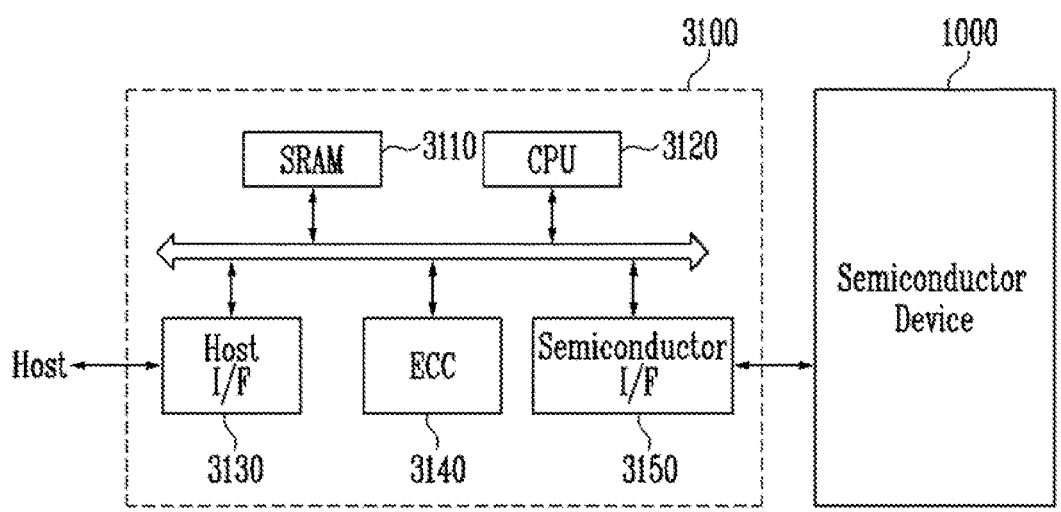
FIG. 16 is a block diagram illustrating a memory system including a semiconductor device according to an embodiment of the present disclosure.

FIG. 16 is a block diagram illustrating a memory system including a semiconductor device according to an embodiment of the present disclosure.

Referring to FIG. 16, the memory system 3000 may include a memory controller 3100 and a semiconductor device 1000.

The semiconductor memory device 1000 may be configured substantially identical to the semiconductor device of FIG. 1, and therefore, detailed descriptions of the semiconductor device 1000 will be omitted.

The memory controller 3100 may be configured to control the semiconductor device 1000. An SRAM 3110 may be used as a working memory of a CPU 3120. A host interface (host I/F) 3130 may be provided with a data exchange protocol of a host coupled to the memory system 3000. An error correction circuit (ECC) 3140 provided in the memory controller 3100 may detect and correct errors included in data read out from the semiconductor device 1000. A semiconductor interface (semiconductor I/F) 3150 may interface with the semiconductor device 1000. The CPU 3120 may perform a control operation for data exchange of the memory controller 3100. Although not shown in FIG. 16, the memory system 300 may further include a ROM (not shown) for storing code data for interfacing with the host.

The memory system 3000 may be applied to a computer, a ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital video recorder, a digital video player, a device capable of transmitting/receiving information in a wireless environment, and one of various electronic devices that constitute a home network.

Figure 17:
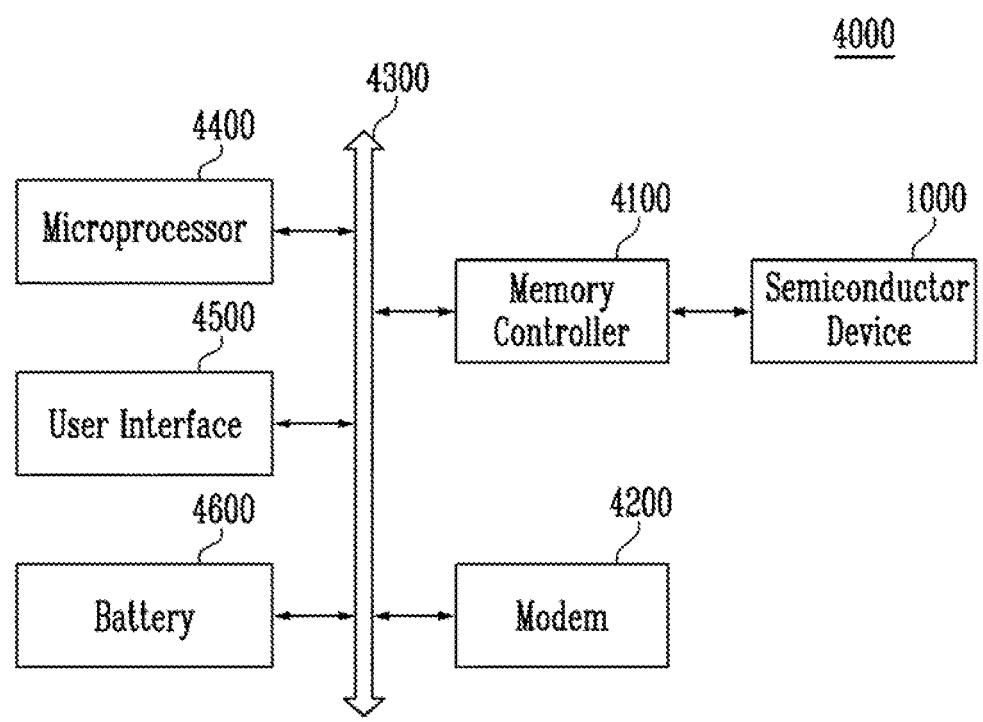
FIG. 17 is a block diagram illustrating a schematic configuration of a computing system including a semiconductor device according to an embodiment of the present disclosure.

FIG. 17 is a block diagram illustrating a schematic configuration of a computing system including a semiconductor device according to an embodiment of the present disclosure.

Referring to FIG. 17, the computing system 4000 includes a semiconductor device 1000, a memory controller 4100, a modem 4200, a microprocessor 4400, and a user interface 4500, which are electrically coupled to a bus 4300. When the computing system 4000 is a mobile device, a battery 4600 for supplying operation voltages of the computing system 4000 may be additionally provided in the computing system 4000. Although not shown in this figure, the computing system 4000 may further include an application chip set, a camera image processor (CIS), a mobile DRAM, and the like.

The semiconductor device 1000 may be configured substantially the same as the semiconductor device of FIG. 1, and therefore a detailed description of the semiconductor device 1000 will be omitted.

The semiconductor device and the memory controller may be packaged in various forms. For example, the semiconductor device and the memory controller may be packaged in a package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

According to the present disclosure, it is possible to narrow the threshold voltage distribution of select transistors, dummy cells, and memory cells, and prevent the generation of leakage current in strings, thereby improving the reliability of the semiconductor device.

Embodiments have been disclosed herein, and although specific terms are employed, they are used and are to be interpreted in a generic and descriptive sense only and not for the purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and detail may be made without departing from the spirit and scope of the present disclosure as set forth in the following claims.

What is claimed is:

1. A semiconductor device comprising:
   memory blocks including a plurality of strings in which memory cells are coupled between select transistors;
   a peripheral circuit suitable for erasing or programming the select transistors and the memory cells, which are included in a selected memory block among the memory blocks; and
   a control circuit suitable for controlling the peripheral circuit to erase the select transistors and the memory cells, increasing a threshold voltage of the select transistors within a range below an erase level, and increasing the threshold voltage of the select transistors up to a program level.

2. The semiconductor device of claim 1, wherein the strings are coupled between bit lines and a common source line.

3. The semiconductor device of claim 1, wherein the memory cells are coupled between the select transistors.

4. The semiconductor device of claim 1, wherein the peripheral circuit includes:
   a voltage generating circuit suitable for generating operation voltages of various levels in response to an operation signal;
   a row decoder suitable for transmitting the operation voltages to the selected memory block in response to a row address;
   a page buffer coupled to the memory blocks through the bit lines, and suitable for transmitting/receiving data to/from the selected memory block in response to a page buffer control signal during program, read, and erase operations and temporarily storing the data;

a column decoder suitable for transmitting/receiving the data to/from the page buffer in response to a column address; and an input/output circuit suitable for transferring a command and an address from the outside to the control circuit, and transmitting/receiving the data to/from the column decoder.

5. The semiconductor device of claim 1, wherein the control circuit controls the peripheral circuit to apply a sub-soft program voltage to select lines coupled to the select transistors in order to increase the threshold voltage of the select transistors within the range below the erase level.

6. The semiconductor device of claim 5, wherein the control circuit controls the peripheral circuit to apply the sub-soft program voltage to the select lines without a verify operation while increasing the threshold voltage.

7. The semiconductor device of claim 5, wherein the sub-soft program voltage is a positive voltage.

8. The semiconductor device of claim 5, wherein the control circuit controls the peripheral circuit to apply to the select lines once or more times the sub-soft program voltage with one or more different levels.

9. The semiconductor device of claim 1, wherein the control circuit controls the peripheral circuit to increase a threshold voltage of the memory cells while increasing the threshold voltage of the select transistors.

10. The semiconductor device of claim 1, wherein the strings further include dummy cells between the select transistors and the memory cells.

11. The semiconductor device of claim 10, wherein the control circuit controls the peripheral circuit to increase a threshold voltage of the dummy cell while increasing the threshold voltage of the select transistors.

12. The semiconductor device of claim 1,
wherein the strings include two sub-strings coupled to each other through a pipe transistor, and
wherein the control circuit controls the peripheral circuit to increase a threshold voltage of the pipe transistor while increasing the threshold voltage of the select transistors.

13. A method of operating a semiconductor device, the method comprising:
erasing select transistors and memory cells;
increasing a threshold voltage of the select transistors within a range below an erase level by applying a sub-soft program voltage to select lines coupled to the select transistors; and
increasing the threshold voltage of the select transistors up to a program level by programming the select transistors.

14. The method of claim 13, wherein the sub-soft program voltage is a positive voltage.

15. The method of claim 13, wherein the applying of the sub-soft program voltage to the select lines is performed without a verify operation of the select transistors.

16. The method of claim 15, wherein the applying of the sub-soft program voltage to the select lines is performed by applying to the select lines once or more times the sub-soft program voltage with one or more different levels.

17. The method of claim 13, further comprising increasing a threshold voltage of the memory cells during the increasing of the threshold voltage of the select transistors.

18. The method of claim 13, further comprising increasing a threshold voltage of dummy cells coupled between the select transistors and the memory cells during the increasing of the threshold voltage of the select transistors.

19. The method of claim 13, further comprising performing, between the increasing within the range below the erase level and increasing up to the program level, a main soft program operation for narrowing a threshold voltage distribution of the memory cells.

20. The method of claim 19, wherein the main soft program operation is performed using an incremental step pulse program (ISPP) method.

21. The method of claim 13, wherein the programming of the select transistors is performed using the ISPP method.

* * * * *